United States Patent
Feilkas et al.

(10) Patent No.: US 6,853,262 B2
(45) Date of Patent: Feb. 8, 2005

(54) VOLTAGE-CONTROLLED OSCILLATOR CIRCUIT WHICH COMPENSATES FOR SUPPLY VOLTAGE FLUCTUATIONS

(75) Inventors: Klaus-Jürgen Feilkas, München (DE); Hans Geltinger, Schliersee (DE); Jose Pedro Moreira, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/724,904

(22) Filed: Dec. 1, 2003

(65) Prior Publication Data

US 2004/0108910 A1 Jun. 10, 2004

Related U.S. Application Data

(63) Continuation of application No. PCT/DE02/01994, filed on May 29, 2002.

(30) Foreign Application Priority Data

May 31, 2001 (DE) .......................................... 101 26 594

(51) Int. Cl.$^7$ ................................................ H03B 5/00
(52) U.S. Cl. ............................ 331/117 R; 331/117 FE; 331/117 V; 331/175; 331/167
(58) Field of Search ......................... 331/117 V, 117 R, 331/167, 36 C, 117 FE

(56) References Cited

U.S. PATENT DOCUMENTS

| 4,378,534 | A | 3/1983 | Goedken et al. ............. 332/124 |
| 5,600,279 | A | 2/1997 | Mori ........................ 331/36 C |
| 5,714,915 | A | 2/1998 | Brilka ..................... 331/117 R |
| 6,147,567 | A | 11/2000 | Welland et al. ............. 331/179 |
| 6,150,891 | A | 11/2000 | Welland et al. ............... 331/25 |
| 6,167,245 | A | 12/2000 | Welland et al. ............. 455/260 |

OTHER PUBLICATIONS

Tietze, U. et al.: "Halbleiter–Schaltungstechnik", Springer Verlag, $10^{th}$ ed., 1993, pp. 543–555 and English translation Tietze, U. et al.: "Electronic Circuits", Springer Verlag, $9^{th}$ ed., 1991, pp. 484–497.

*Primary Examiner*—Arnold Kinkead
(74) *Attorney, Agent, or Firm*—Laurence A. Greenberg; Werner H. Stemer; Ralph E. Locher

(57) ABSTRACT

A voltage-controlled oscillator circuit compensates for supply voltage fluctuations of the oscillator and thus for frequency fluctuations at the oscillator output. An additional voltage-controlled capacitor is connected in parallel with the voltage-controlled capacitor of the LC resonant circuit. The control terminal of the second voltage-controlled capacitor is coupled to the supply voltage terminal, which feeds the oscillator circuit. The oscillator circuit can be monolithically integrated and can be employed in phase-locked loops, for example.

7 Claims, 4 Drawing Sheets

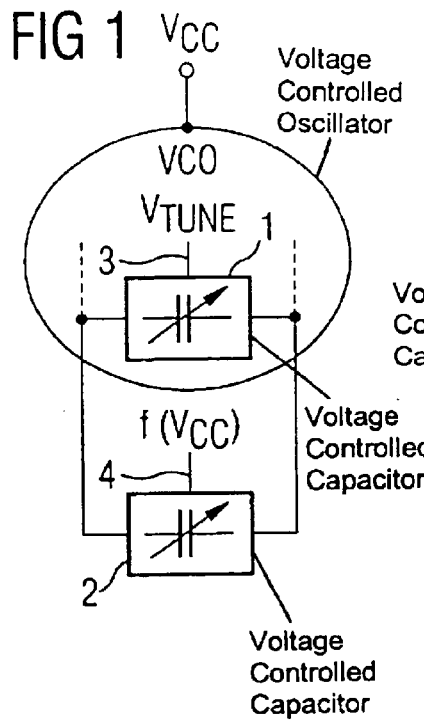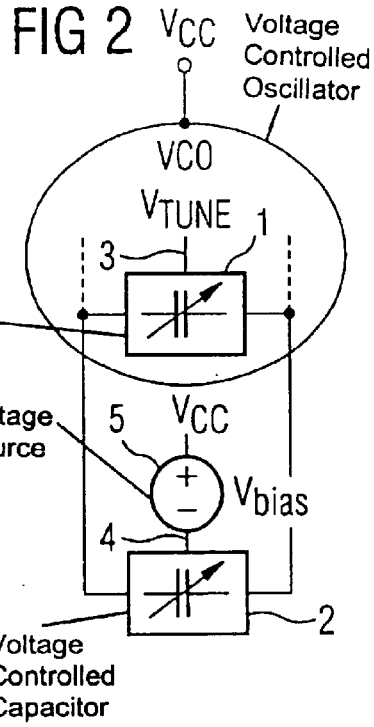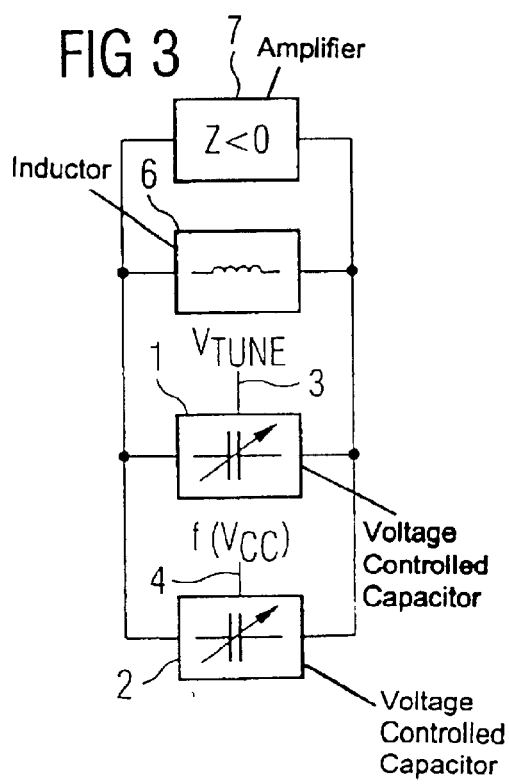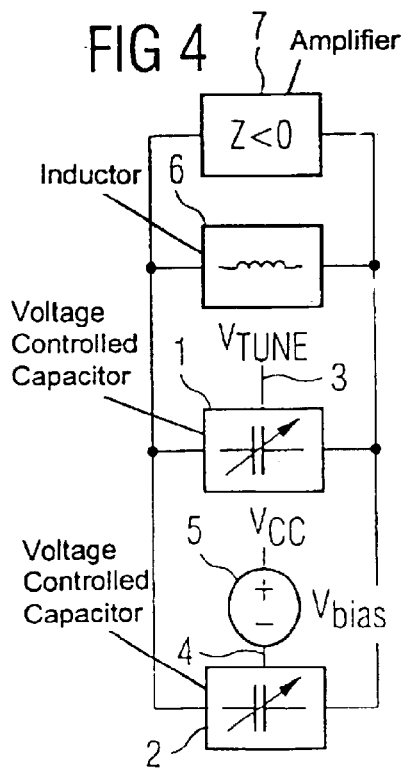

VOLTAGE-CONTROLLED OSCILLATOR CIRCUIT WHICH COMPENSATES FOR SUPPLY VOLTAGE FLUCTUATIONS

CROSS-REFERENCE TO RELATED APPLICATION

This application is a continuation of copending International Application No. PCT/DE02/01994, filed May 29, 2002, which designated the United States and was not published in English.

BACKGROUND OF THE INVENTION

Field of the Invention

The present invention relates to a voltage-controlled oscillator circuit.

Voltage-controlled oscillators, VCOs, are usually constructed as LC oscillators. In this case, a sinusoidal oscillation is generated by deattenuating the LC resonant circuit using an amplifier.

The capacitor is usually provided as tuneable component, and may be designed, for example, as a variable-capacitance diode.

Such voltage-controlled oscillators with an LC resonator are suitable for integration in integrated circuits and can be employed in phase-locked loops (PLLs), for example.

In integrated circuits, the supply voltage of individual circuit blocks may fluctuate since, by way of example, further circuit blocks having the same supply voltage source are switched on or off. However, a fluctuation of the supply voltage causes a fluctuation of the oscillation frequency at the output of a voltage-controlled oscillator, which is also referred to as a pushing effect. Fluctuations in the oscillation frequency of the oscillator are normally undesirable, however, since downstream circuit blocks require specific input frequency accuracies at their inputs.

Moreover, fluctuations of the operating temperature of an integrated oscillator circuit may cause additional frequency deviations as a result of drift effects. However, this requires a higher tuning range of the oscillator and is therefore likewise undesirable.

Since fluctuations of the oscillator frequency are often caused by fluctuations of the amplitude of the oscillator signal, which are in turn caused by fluctuations of the supply voltage, it is conceivable to stabilize the amplitude of the oscillator signal by using an amplitude control loop. However, this increases the noise in the circuit in an often impermissible manner. It would likewise be conceivable to use higher-quality capacitors or tuneable capacitors whose capacitance values have lower sensitivities to amplitude fluctuations. However, in the case of monolithically integrating the oscillator circuit, limits are imposed in this case on the one hand due to the dictate of production and on the other hand for cost reasons.

Furthermore, the supply voltage of the oscillator could be provided by a voltage regulator, see for example Tietze, Schenk: Halbleiter-Schaltungstechnik [semiconductor circuitry], 10th edition 1993, page 543 et seq. However, a regulated output voltage provided in this way is less than the input voltage of the regulator at least by a base-emitter voltage. Moreover, an undesirable additional phase noise would be introduced into the downstream circuit.

As already explained, a temperature-dictated fluctuation of the oscillator frequency or a drifting away of the oscillator frequency can be combated by increasing the tuning range of the oscillator. However, this is likewise associated with disadvantages, for example, an increase in the tolerances of the VCO tuning constant $K_{VCO}$.

SUMMARY OF THE INVENTION

It is accordingly an object of the invention to provide a voltage-controlled oscillator circuit that overcomes the above-mentioned disadvantages of the prior art apparatus of this general type.

In particular, it is an object of the invention to provide a voltage-controlled oscillator circuit that is suitable for monolithic integration and that enables compensation of voltage-fluctuation-dictated deviations of the oscillator frequency with a low outlay.

With the foregoing and other objects in view there is provided, in accordance with the invention, a voltage-controlled oscillator circuit including an LC resonator with an inductor and a first voltage-controlled capacitor for setting an oscillation frequency. The voltage-controlled oscillator circuit includes a deattenuation amplifier for providing a negative impedance which is coupled to the LC resonator. The voltage-controlled oscillator circuit also includes a supply voltage terminal that is coupled to the deattenuation amplifier for feeding a supply voltage. The voltage-controlled oscillator circuit also includes a second voltage-controlled capacitor that is connected in parallel with the first voltage-controlled capacitor. The second voltage-controlled capacitor has a control terminal coupled to the supply voltage terminal for obtaining the supply voltage or a voltage derived from the supply voltage.

The control terminal of the second voltage-controlled capacitor, which is tuneable with regard to its capacitance value as a result of a control voltage being fed in, may be driven either with a voltage derived from the supply voltage or by the supply voltage itself.

Connecting the load terminals of the first and second voltage-controlled capacitors in parallel and driving their capacitance values make it possible, in a simple manner, to compensate for voltage fluctuations and to thereby avoid fluctuations of the oscillator output frequency, since the capacitance of the second voltage-controlled capacitor decreases if the supply voltage of the oscillator increases. The frequency drift is thereby compensated for. If the supply voltage increases, the frequency of the oscillator at the same time decreases, and vice versa. The control voltage is fed to the cathode of the second voltage-controlled capacitor if the capacitor is designed as a varactor diode.

The adjustable capacitance values of the second voltage-controlled capacitor are preferably significantly lower than the adjustable capacitance values of the first voltage-controlled capacitor.

The voltage-controlled oscillator circuit described has good phase noise properties because of the compensation described and may be constructed as push-pull oscillator, for example, in order to further improve the noise properties. Moreover, higher powers and better efficiencies are possible as a result of this.

With a tuning voltage that can be fed to the first voltage-controlled capacitor of the control terminal, the oscillator frequency can be tuned in the customary manner in the case of VCOs.

In one preferred embodiment of the present invention, the control terminal of the second voltage-controlled capacitor is connected to the supply voltage terminal via a voltage source.

The voltage source provides a bias voltage. This bias voltage provided by the voltage source may be used to operate the oscillator circuit in a more suitable operating range, for example, at a desired operating point. If the voltage source used supplies a temperature-dependent voltage, then the voltage source may be used for temperature compensation of the oscillator. In this case, this voltage depends on the ambient temperature of the circuit and on the supply voltage of the circuit. Given a suitable design of the voltage source, temperature-dictated frequency drifts can be compensated for in the case of the present oscillator circuit. The temperature compensation follows the following principle in this case:

If the operating temperature of the oscillator circuit rises, the voltage provided by the voltage source also rises, so that the capacitance value of the second voltage-controlled capacitor decreases and thus counteracts the increase in the capacitance value of the first voltage-controlled capacitor in the LC resonator.

In a further preferred embodiment of the present invention, the voltage source is designed as a diode for connecting the control terminal of the second voltage-controlled capacitor to the supply voltage terminal.

Instead of a diode, the voltage source may also include a plurality of series-connected diodes, depending on the design of the circuit.

The control voltage of the second voltage-controlled capacitor is accordingly the supply voltage minus one or more diode voltages, depending on the design. In this case, the diode voltage is temperature-dependent and thereby counteracts the temperature dependence of the oscillator frequency.

In a further preferred embodiment of the present invention, the control terminal of the second voltage-controlled capacitor is connected to the supply voltage terminal via a transistor connected as a diode.

A transistor whose control terminal is short-circuited to one of its load terminals in order to form a diode can be integrated in a simple manner in integrated circuit technology.

In a further advantageous embodiment of the present invention, the transistor is a bipolar transistor. A bipolar transistor which is connected as a diode and is connected between the supply voltage terminal of the oscillator circuit and the control terminal of the second variable-capacitance diode enables particularly precise simulation of the thermal behavior of the output frequency of the oscillator circuit and thus precise compensation thereof.

In a further preferred embodiment of the present invention, the deattenuation amplifier includes two cross-coupled transistors. The two cross-coupled transistors make it possible to embody the oscillator circuit as a push-pull oscillator and are alternately turned on for this purpose. The cross-coupling of the transistors is provided by the fact that a respective control terminal of one transistor is connected to a respective load terminal of another transistor of the transistor pair directly electrically, capacitively or by a transformer. The respective free load terminals of the two transistors are directly connected to one another and to a current source for supplying the deattenuation amplifier. In this case, the current source is preferably connected to the supply voltage terminal. The cross-coupled load terminals are preferably connected to the LC resonator, which is likewise constructed using symmetrical circuit technology.

The transistors are preferably designed as field-effect transistors and are constructed using MOS circuit technology.

In a further preferred embodiment of the present invention, first and second voltage-controlled capacitors each include two variable-capacitance diodes. The cathodes of the variable-capacitance diodes are directly connected to one another. In this case, the connecting node of the variable-capacitance diodes at their cathode terminals is at the same time in each case the control terminal of the first and second voltage-controlled capacitors.

In order to obtain a parallel circuit including the first and second voltage-controlled capacitors, the anode terminals of the variable-capacitance diodes are in each case connected to one another in pairs in the case of the present preferred embodiment.

Accordingly, the control voltage or tuning voltage of the oscillator circuit itself can be coupled in at the cathode terminals of the first voltage-controlled capacitor and the supply voltage or a voltage derived from the supply voltage can be coupled in at the cathode terminals of the varactor diodes forming the second voltage-controlled capacitor.

Other features which are considered as characteristic for the invention are set forth in the appended claims.

Although the invention is illustrated and described herein as embodied in a voltage-controlled oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a simplified block diagram of a voltage-controlled oscillator circuit;

FIG. 2 is a block diagram of the voltage-controlled oscillator circuit shown in FIG. 1 with temperature compensation;

FIG. 3 is a block diagram of the voltage-controlled oscillator circuit shown in FIG. 1 with a parallel LC resonator;

FIG. 4 is a block diagram of the voltage-controlled oscillator circuit shown in FIG. 2 with a parallel LC resonator;

DESCRIPTION OF THE PREFERRED EMBODIMENTS

Figure 5:
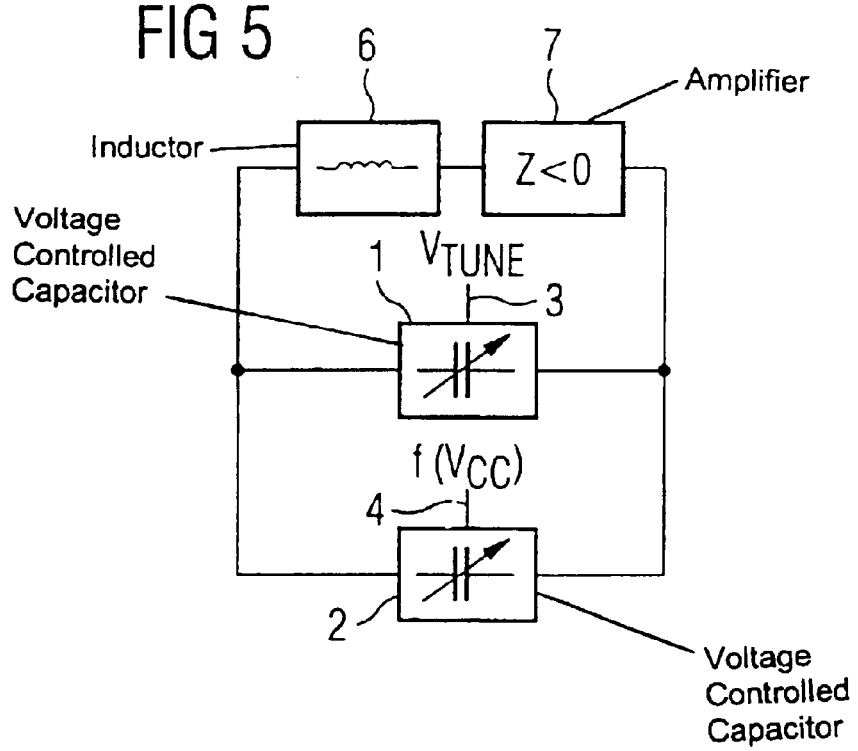
FIG. 5 is a block diagram of the voltage-controlled oscillator circuit shown in FIG. 1 with a series LC resonator.

Referring now to the figures of the drawing in detail and first, particularly, to FIG. 1 thereof, there is shown a voltage-controlled oscillator circuit, having an LC resonator with a first voltage-controlled capacitor 1. A second voltage-controlled capacitor 2 is connected in parallel with the first voltage-controlled capacitor 1. For this purpose, a respective load terminal of the first voltage-controlled capacitor 1 is directly connected to a respective load terminal of the second voltage-controlled capacitor 2. The first voltage-controlled capacitor 1 and the second voltage-controlled capacitor 2 each have a control terminal (3 or 4, respectively) for setting their capacitance value. A tuning voltage $V_{TUNE}$ can be fed to the control terminal 3 of the first voltage-controlled capacitor 1 for the purpose of setting an oscillation frequency of the oscillator. The voltage-controlled oscillator circuit is connected to a supply voltage terminal $V_{CC}$ for its voltage supply.

The control terminal 4 of the second voltage-controlled capacitor 2 is coupled to the supply voltage terminal $V_{CC}$ for feeding a signal derived from the supply voltage.

In this case, the control voltage of the second voltage-controlled capacitor 2 is derived from the supply voltage $V_{CC}$ of the oscillator circuit in such a way as to compensate for supply-voltage-fluctuation-dictated frequency deviations of the oscillator frequency.

FIG. 2 shows a development of the oscillator circuit of FIG. 1. A description of identical circuit parts with identical functions as in FIG. 1 will not be repeated here. An added voltage source 5 has one terminal connected to the supply voltage terminal $V_{CC}$ and another terminal connected to the control input 4 of the second voltage-controlled capacitor 2. In this case, the voltage source 5 provides a voltage at the control input 4. This voltage at the control input 4 is dependent on temperature and is dependent on the supply voltage and compensates for frequency drifts at the output of the oscillator circuit that are temperature-dictated. In the case of an oscillator whose oscillator frequency decreases if the supply voltage $V_{CC}$ increases, the capacitance of the second voltage-controlled capacitor 2 decreases if the supply voltage $V_{CC}$ increases. For this purpose, the voltage provided by the voltage source 5 increases with increasing temperature in such a way as to precisely compensate for temperature-dictated frequency drifts in the oscillator.

FIG. 3 shows a development of the oscillator circuit of FIG. 1, in which the LC resonator is embodied as a parallel resonator. For this purpose, a deattenuation amplifier 7 is connected in parallel with an inductor 6 and in parallel with the first voltage-controlled capacitor 1. These three components together form a voltage-controlled oscillator circuit which, as a result of a second voltage-controlled capacitor 2 being connected in parallel, as already explained, has a stabilized oscillator frequency with respect to fluctuations of the supply voltage.

FIG. 4 shows the oscillator circuit of FIG. 3, with an added voltage source 5 as has been described with regard to FIG. 2. The parallel resonator has a parallel circuit including the deattenuation amplifier 7, the inductor 6 and the first voltage-controlled capacitor 1, as already explained for FIG. 3. The control input 4 of the second voltage-controlled capacitor 2 is connected via a voltage source 5 to a supply voltage terminal $V_{CC}$. The voltage source 5, as already explained, provides a voltage at the control input 4 of the second voltage-controlled capacitor 2 which counteracts temperature-dictated and voltage-fluctuation-dictated frequency deviations of the oscillator.

FIG. 5 is a block diagram showing an alternative to realizing an LC resonator circuit as a parallel resonator as was shown in FIG. 3. The voltage controlled oscillator VCO shown in FIG. 5 is an embodiment of the circuit shown in FIG. 1 that is constructed with an LC series resonant circuit. In this case, the inductor 6 and the deattenuation amplifier 7 are connected in a series circuit for providing a negative impedance. The first voltage-controlled capacitor 1 is connected in parallel with the series circuit. A second voltage-controlled capacitor 2 is connected in parallel with the first voltage-controlled capacitor 1 and thus also with the series circuit made of the inductor 6 and the deattenuation amplifier 7 connected in series. The function of the circuit in accordance with FIG. 5 corresponds to that of FIG. 3 with the advantages mentioned and will not be repeated at this point.

Figure 6:
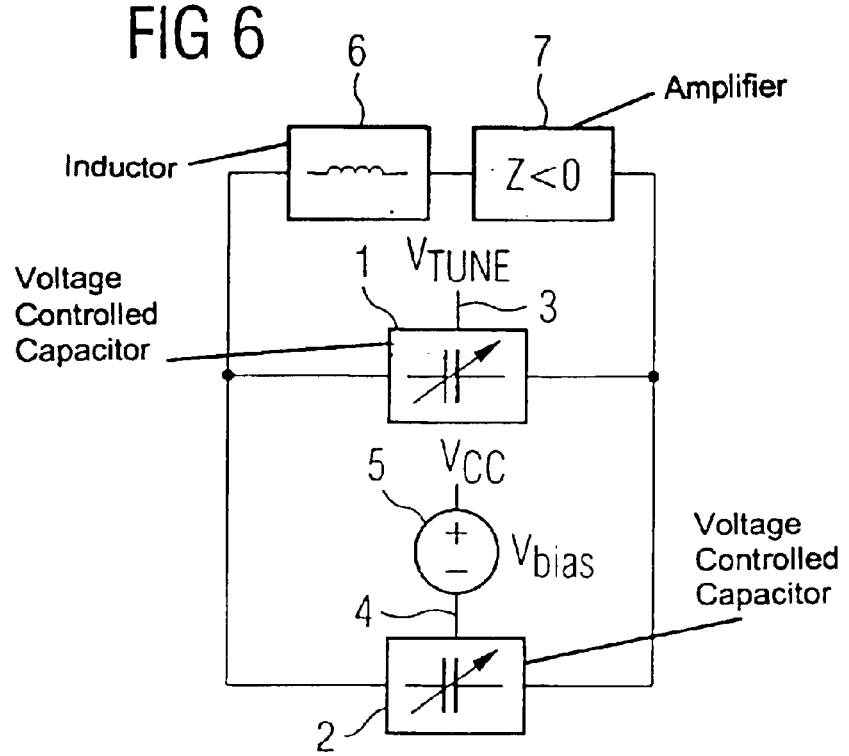
FIG. 6 is a block diagram of the voltage-controlled oscillator circuit shown in FIG. 2 with a series LC resonator.

FIG. 6 shows, as an alternative to the block diagram in accordance with FIG. 4, the embodiment of an oscillator circuit in accordance with FIG. 2 but with an LC series resonant circuit. In this case, a series circuit including the inductor 6 and the deattenuation amplifier 7 is formed. The first voltage-controlled capacitor 1 is connected in parallel with the series circuit. A second voltage-controlled capacitor 2 is connected in parallel with the first voltage-controlled capacitor 1. The control input of the second voltage-controlled capacitor 2, provided with reference symbol 4, is connected to the supply potential terminal $V_{CC}$ via the voltage source 5. The circuit in accordance with FIG. 6 corresponds in terms of its function and its advantageous modes of operation to the circuit illustrated in FIG. 2, and, therefore, this description will not be repeated again here.

Figure 7:
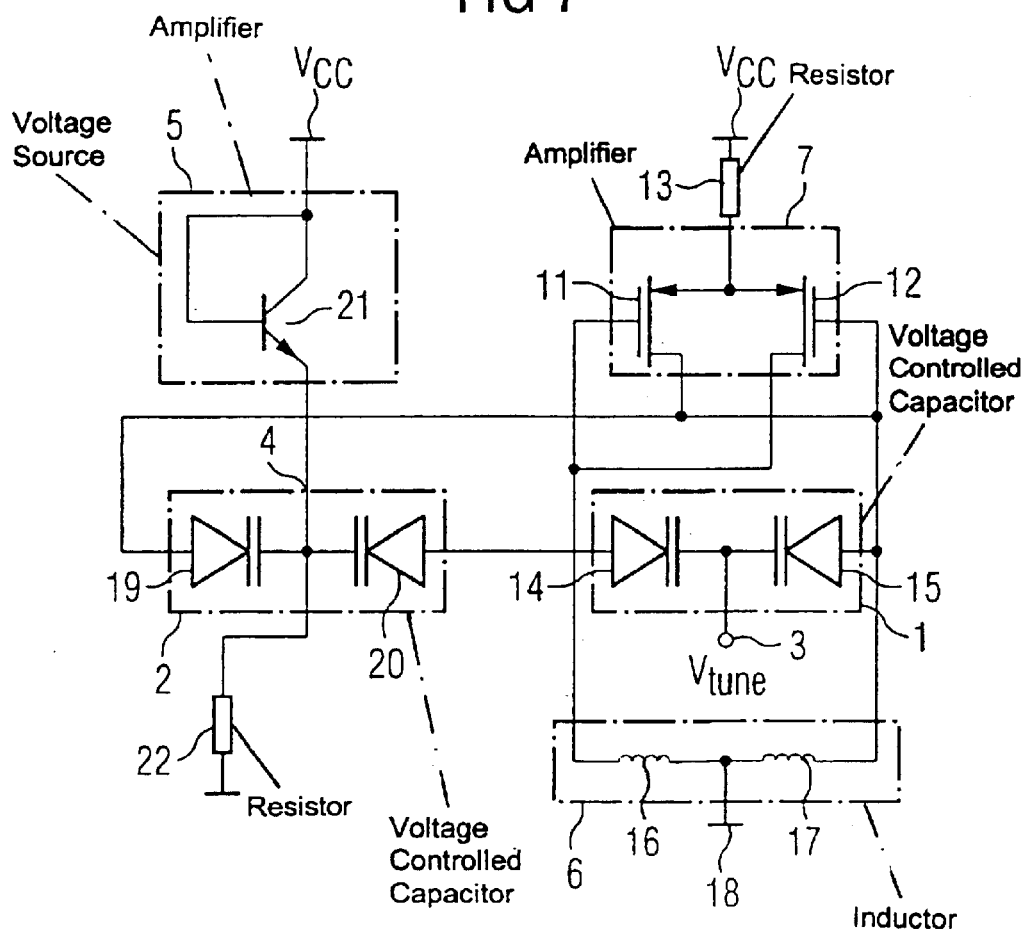
FIG. 7 is a circuit diagram of an exemplary embodiment of the oscillator circuit.

FIG. 7 shows a simplified circuit diagram of a voltage-controlled oscillator embodied as a push-pull oscillator with a compensation of the oscillator frequency with regard to the operating temperature and with regard to fluctuations of the supply voltage $V_{CC}$ in a development in accordance with FIG. 2.

Specifically, the push-pull oscillator includes a parallel circuit formed by first voltage-controlled capacitor 1, the inductor 6 and the deattenuation amplifier 7. In this case, the deattenuation amplifier 7 includes two transistors 11, 12, which are directly electrically cross-coupled to one another. The transistors 11, 12 are designed as MOS, metal oxide semiconductor field-effect transistors. In order to form the direct electrical cross-coupling, the gate terminal of the transistor 11 is directly connected to the drain terminal of the transistor 12 and conversely the gate terminal of the transistor 12 is directly connected to the drain terminal of the transistor 11. The source terminals of the transistors 11, 12 are directly connected to one another and to a current source designed as resistor 13. The resistor 13 is connected to the supply voltage terminal $V_{CC}$ by a further terminal.

The first voltage-controlled capacitor 1 includes two varactor diodes 14, 15. The cathode terminals of the varactor diodes 14, 15 are directly connected to one another and to the control terminal 3 of the first voltage-controlled capacitor 1. A respective anode terminal of the varactor diodes 14, 15 is connected to a respective gate terminal of the transistors 11, 12.

The inductor 6 includes two partial inductors 16, 17. One terminal of each of the partial inductors 16, 17 is connected to one another and to a reference-ground potential terminal 18. Another terminal of each of the partial inductors 16, 17 is connected to a respective anode terminal of the varactor diodes 14, 15.

A second voltage-controlled capacitor 2 includes two varactor diodes 19, 20 having cathode terminals directly connected to one another. The second voltage-controlled capacitor 2 is connected in parallel with the first voltage-controlled capacitor 1. For this purpose, the anode terminals of the varactor diodes 14, 20 and the anode terminals of the varactor diodes 15, 19 are directly connected to one another. The control terminal 4 of the second voltage-controlled capacitor 2 is formed at the common cathode terminal of the varactor diodes 19, 20. In order to form a voltage source 5 between the supply potential terminal $V_{CC}$ and the control terminal 4, a bipolar transistor 21 is provided, which is connected as a diode. The bipolar transistor 21 is designed as an npn transistor whose collector terminal is connected directly to its base terminal and to the reference-ground potential terminal $V_{CC}$ and whose emitter terminal is connected to the control terminal 4 of the second voltage-controlled capacitor 2. The emitter of the transistor 21 is furthermore connected to reference-ground potential via a current path including a resistor 22 in the present exemplary embodiment.

On the emitter of the transistor 21, there is a voltage which depends on the supply potential $V_{CC}$ and on the ambient temperature and controls the capacitance value of the second voltage-controlled capacitor 2 in a manner dependent on temperature and supply voltage $V_{CC}$. In this case, this driving is designed in such a way as to precisely compensate for fluctuations of the supply voltage and also operating temperature fluctuations that would in each case lead to fluctuations of the oscillator frequency.

The present voltage-controlled oscillator circuit makes it possible, with good noise properties and without additionally extending the tuning range for compensating for drift effects, to stabilize the oscillator frequency of the voltage-controlled oscillator with respect to fluctuations of the supply voltage and with respect to fluctuations of the operating temperature of the circuit. The voltage-controlled oscillator circuit can be implemented with a low outlay on circuitry.

Figure 8:
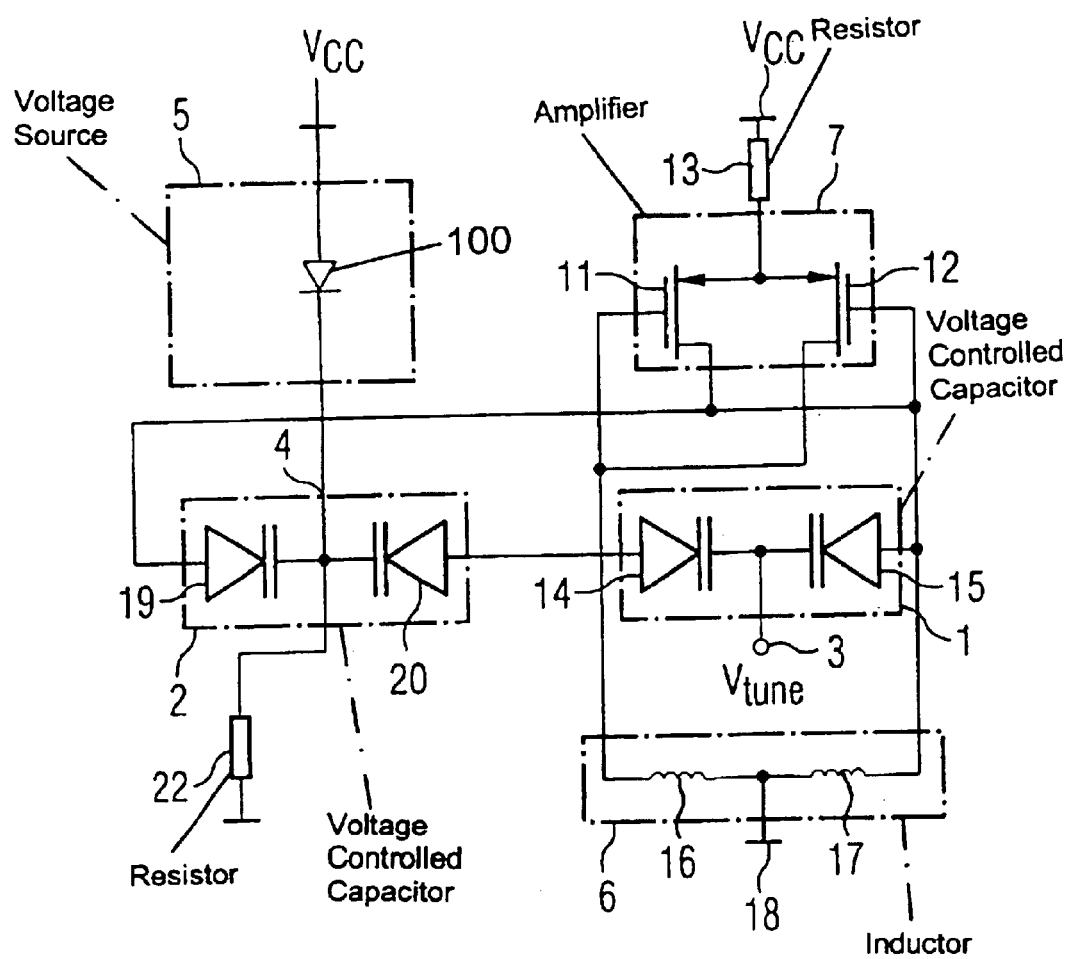
FIG. 8 is a circuit diagram of the oscillator circuit shown in FIG. 7, but with the voltage source formed by a diode.

FIG. 8 is a simplified circuit diagram of the voltage-controlled oscillator shown in FIG. 7, but with the voltage source formed by a diode 100.

We claim:

1. A voltage-controlled oscillator circuit, comprising:

an LC resonator including an inductor and a first voltage-controlled capacitor for setting an oscillation frequency;

a deattenuation amplifier for providing a negative impedance, said deattenuation amplifier coupled to said LC resonator;

a supply voltage terminal for obtaining a supply voltage, said supply voltage terminal coupled to said deattenuation amplifier; and a second voltage-controlled capacitor connected in parallel with said first voltage-controlled capacitor;

said second voltage-controlled capacitor having a control terminal coupled to said supply voltage terminal for obtaining a voltage derived from said supply voltage for compensating for frequency deviations of the oscillator frequency caused by supply voltage fluctuations.

2. The oscillator circuit according to claim 1, further comprising:

a voltage source coupling said control terminal of said second voltage-controlled capacitor to said supply voltage terminal.

3. The oscillator circuit according to claim 1, further comprising:

a diode coupling said control terminal of said second voltage-controlled capacitor to said supply voltage terminal.

4. The oscillator circuit according to claim 1, further comprising:

a transistor coupling said control terminal of said second voltage-controlled capacitor to said supply voltage terminal;

said transistor connected as a diode.

5. The oscillator circuit according to claim 4, wherein said transistor is a bipolar transistor.

6. The oscillator circuit according to claim 1, wherein said deattenuation amplifier includes two cross-coupled transistors.

7. The oscillator circuit according to claim 1, wherein:

said first voltage-controlled capacitor includes two variable-capacitance diodes having cathodes connected to one another; and said second voltage-controlled capacitor includes two variable-capacitance diodes having cathodes connected to one another.

* * * * *